United States Patent [19]
Wen

[11] Patent Number: 5,866,457
[45] Date of Patent: Feb. 2, 1999

[54] SEMICONDUCTOR READ-ONLY MEMORY DEVICE AND METHOD OF FABRICATING THE SAME

[75] Inventor: Jemmy Wen, Hsinchu, Taiwan

[73] Assignee: United Microelectronics Corp., Hsinchu, Taiwan

[21] Appl. No.: 843,343

[22] Filed: Apr. 15, 1997

[30] Foreign Application Priority Data

Jan. 16, 1997 [TW] Taiwan .................................. 86100448

[51] Int. Cl.⁶ .............................................. H01L 21/8234
[52] U.S. Cl. ............................................ 438/275; 438/282
[58] Field of Search ..................................... 438/275–281; 257/390–391

[56] References Cited

U.S. PATENT DOCUMENTS 5,668,031  9/1997  Hsue et al. ............................... 438/275

*Primary Examiner*—Jey Tsai
*Assistant Examiner*—Joni Y. Chang
*Attorney, Agent, or Firm*—Finnegan, Henderson, Farabow, Garrett & Dunner, L.L.P.

[57] ABSTRACT

A new semiconductor structure for a ROM device and a method for fabricating the same are provided. The ROM device includes a plurality of trench-type source/drain regions which serve as a plurality of bit lines for the ROM device. By this method, the conventional step of using ion implantation to form the bit lines can be eliminated. Further, an insulating layer is formed between the source/drain regions and the underlying substrate such that the leakage current in the junction between the source/drain regions and the substrate can be minimized. The ON/OFF state of each of the MOSFET memory cells of the ROM device is dependent on whether the associated channel region comes into lateral contact with the neighboring source/drain regions through a mask removed portion of the insulating layer. A particular MOSFET memory cell is set to a permanently-ON state provided that its source/drain regions come into lateral contact with the associated channel region through a removed portion of the insulating layer, and is set to a permanently-OFF state otherwise. The new semiconductor structure for the ROM device allows for an increase in the breakdown voltage of the source/drain regions and thereby the operating current of the memory cells during access operation.

26 Claims, 5 Drawing Sheets

SEMICONDUCTOR READ-ONLY MEMORY DEVICE AND METHOD OF FABRICATING THE SAME

BACKGROUND OF THE INVENTION

1. Field of the Invention

This invention relates to semiconductor memory devices, and more particularly, to an improved semiconductor structure for a ROM (read-only memory) device of the type including an array of MOSFET (metal-oxide semiconductor field-effect transistor) memory cells and a method of fabricating the same. It is a characteristic feature of the invention that an insulating layer is used for mask programming of data into the ROM device.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the data to be permanently stored in ROMs is usually first defined by the customer and then furnished to the factory to be programmed into the ROMs.

Most ROMs are identical in semiconductor structure except for the different data stored therein. Therefore, the ROM devices can be fabricated up to the stage ready for programming and then the semi-finished products can be stocked in inventory to await customer orders. The customer then furnishes the data to the factory where the data are to be stored in the semi-finished ROMs by using the so-called mask programming process. This procedure is now a standard method in the semiconductor industry for fabricating ROMs.

In most ROMs, metal-oxide semiconductor field-effect transistors (MOSFET) are used as the memory cells for stored data. In the mask programming stage, impurities are selectively diffused into specific channels of the MOSFET memory cells so as to change the threshold voltage thereof, thereby setting the MOSFET memory cells to ON/OFF states representing different binary data. The MOSFET memory cells are connected to the external circuits via a plurality of polysilicon-based word lines and bit lines. The channel regions are located beneath the word lines and between each pair of adjacent bit lines. Whether one MOSFET memory cell is set to store a binary digit of 0 or 1 is dependent on whether the associated channel is diffused with impurities or not. If the associated channel is diffused with impurities, the MOSFET memory cell is set to have a low threshold voltage, effectively setting the MOSFET memory cell to a permanently-ON state representing the storage of a binary digit of 0, for example; otherwise, the MOSFET memory cell is set to have a high threshold voltage, effectively setting the MOSFET memory cell to a permanently-OFF state representing the storage of a binary digit of 1.

One conventional ROM device is shown in FIGS. 1A through 1C, in which FIG. 1A is a schematic top view of the ROM device; FIG. 1B is a cross-sectional view of the ROM device of FIG. 1 cutting through the line 1B—1B ; and FIG. 1C is a cross-sectional view of the ROM device of FIG. 1 cutting through the line 1C—1C.

As shown, the conventional ROM device includes a semiconductor substrate, such as a P-type silicon substrate, on which a plurality of parallel-spaced bit lines 11 and a plurality of parallel-spaced word lines 13 intercrossing the bit lines 11 are formed. The word lines 13 are separated from the underlying bit lines by an oxidation layer 12. This ROM device includes a plurality of MOSFET memory cells, each being associated with one segment of the word lines 13 between each neighboring pair of the bit lines 11.

Referring to FIG. 1C, in the method for fabricating the foregoing ROM device, the first step is to conduct an ion implantation process so as to diffuse an N-type impurity material, such as arsenic (As), into selected regions of the substrate 10 to form a plurality of parallel-spaced diffusion regions serving as the bit lines 11 The interval region between each neighboring pair of the bit lines 11 serves as a channel region 16. Subsequently, a thermal oxidation process is performed on the wafer so as to form the oxidation layer 12 over the entire top surface of the wafer. Next, a conductive layer, such as a highly-doped polysilicon layer is formed over the wafer, and then selectively removed through a photolithographic and etching process. The remaining portions of the conductive layer serve as the word lines 13. This completes the fabrication of a semi-finished product of the ROM device awaiting a customer order.

In the mask programming process, a mask 15 is placed over the wafer. This mask 15 is predefined to form a plurality of openings according to the bit pattern of the data that are to be programmed into the ROM device for permanent storage. These openings expose those channel regions that are associated with a selected group of MOSFET memory cells that are to set to a permanently-ON state, with all the other MOSFET memory cells being to be set to a permanently-OFF state. Subsequently, an ion implantation process is conducted on the wafer so as to diffuse a P-type impurity material, such as boron, into the exposed channel regions. This completes the so-called code implant process.

In the finished product of the ROM device, the doped channel regions cause the associated MOSFET memory cells to be set to have a low threshold voltage, effectively setting the MOSFET memory cells to a permanently-ON state representing the permanent storage of a first binary digit, for example 0. On the other hand, the undoped channel regions cause the associated MOSFET memory cells to be set to have a high threshold voltage, effectively setting the MOSFET memory cells to a permanently-OFF state representing the permanent storage of a second binary digit, for example 1.

The threshold voltage level of each MOSFET memory cell is dependent on the concentration of the impurity ions diffused into the associated channel region. If the concentration is too high, the threshold voltage of the associated MOSFET memory cell will be raised to a higher level. This may cause the undesired effect of junction breakdown between the source/drain regions and the substrate. To prevent the junction breakdown, the concentration of the implanted impurity ions should be reduced. However, this will cause a decrease in the ratio of the ON-current $I_{ON}$ to the OFF-current $I_{OFF}$ ($I_{ON}$ refers to the current flowing through a permanently-ON MOSFET memory cell during access operation, while $I_{OFF}$ refers to the current flowing through a permanently-OFF MOSFET memory cell during access operation). This drawback will cause the external circuitry to have difficulty in distinguishing between the ON/OFF states of the MOSFET memory cells of the ROM device during access operation. Moreover, the existence of a diode junction between the source/drain regions during access operation causes a large leakage current in the ROM device.

SUMMARY OF THE INVENTION

It is therefore a primary objective of the present invention to provide a new semi-conductor structure for a ROM device which can prevent the leakage current and junction breakdown between the source/drain regions and the substrate through the formation of trench-type source/drain regions.

It is another objective of the present invention to provide a new semiconductor structure for a ROM device by which the programming of data into the memory cells of the ROM device is not by means of ion implantation so as to eliminate the drawbacks associated with ion implantation in the ROM device to increase the operating voltage of the source/drain regions and thereby the operating current of the memory cells during access operation.

It is yet another objective of the present invention to provide a method for fabricating the foregoing new semi-conductor structure for a ROM device.

In accordance with the foregoing and other objectives of the present invention, an improved semiconductor structure for a ROM device and a method of fabricating the same are provided.

The method in accordance with the invention to fabricate a ROM device which can achieve the foregoing objectives includes the following steps of:

(1) preparing a semiconductor substrate of a first type, then forming a pad oxide layer over the substrate;

(2) forming a plurality of substantially parallel-spaced trenches in the substrate along a first direction;

(3) forming an insulating layer which covers the inner wall of the trenches and the top surface of the substrate;

(4) forming a first conductive layer in the trenches, said first conductive layer having a top surface below the top surface of the substrate;

(5) conducting a photolithographic and etching process on the insulating layer so as to remove selected portions of the insulating layer with the surface of the exposed portions of the insulating layer below the top surface of the first conductive layer;

(6) forming a second conductive layer to fill up the trenches, the second conductive layer being doped with an impurity material of a second type;

(7) conducting an etching process on the second conductive layer with the pad oxide layer and the insulating layer serving as etch end points so as to remove part of the second conductive layer until the top surface of the second conductive layer is substantially level with the top surface of the substrate, wherein in each of the trenches, the first conductive layer and the second conductive layer in combination constitute one trench-type source/drain region serving as one bit line;

(8) removing the pad oxide layer;

(9) forming a gate dielectric layer over the second conductive layer;

(10) forming a third conductive layer over the gate dielectric layer; and

(11) removing selected portions of the third conductive layer so as to form a plurality of substantially parallel-spaced gates serving as word lines along a second direction.

The semiconductor structure of the ROM device of the invention includes:

a semiconductor substrate of a first type which is formed with a plurality of substantially parallel-spaced trenches therein along a first direction;

a plurality of trench-type source/drain regions in said trenches to serve as a plurality of bit lines, each trench-type source/drain region including a first conductive layer and a second conductive layer overlaying said first conductive layer;

a plurality of channel regions formed on said substrate between each neighboring pair of said source/drain regions;

an insulating layer formed in each of said trenches for separating said source/drain regions and said channel regions from said substrate, said insulating layer being selectively formed with a removed portion which allows the associated source/drain region to come in contact with the neighboring channel region;

a plurality of diffusion regions formed in said channel regions;

a gate dielectric layer formed over said substrate and said source/drain regions;

a plurality of parallel-spaced gates formed over said gate dielectric layer along a second direction to serve as a plurality of word lines intercrossing said bit lines to form a plurality of MOSFET memory cells, each being associated with one segment of said word lines between each neighboring pair of bit lines;

wherein a first selected group of said MOSFET memory cells have their channel regions brought in contact with the associated source/drain regions through an opening in said insulating layer, thereby setting them to a permanently-ON state representing the permanent storage of a first binary code; and a second selected group of said MOSFET memory cells have their channel regions isolated by said insulating layer, thereby setting them to a permanently-OFF state representing the permanent storage of a second binary code.

In conclusion, the ROM device of the invention has several advantages over the prior art. First, the leakage current is substantially reduced. Second, ion implantation is not necessary in the method of fabricating the ROM device of the invention. This allows for an increase in the operating voltage of the source/drain regions and thus an increase in the operating current of the MOSFET memory cells during access operation. Third, the formation of the source/drain regions by use of conductive materials, such as polysilicon or metal, allows prevention of the breakdown voltage between the source/region junctions.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

FIGS. 2A through 2G are schematic diagrams depicting the steps involved in the method according to the present invention for fabricating a ROM device of the type including a plurality of MOSFET memory cells for permanent data storage.

Figure 1A:
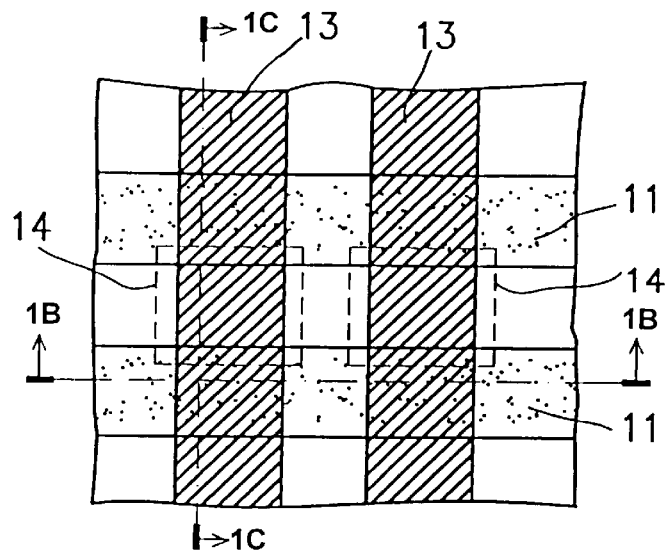
FIG. 1A is a schematic top view of a conventional ROM device.
Figure 1B:
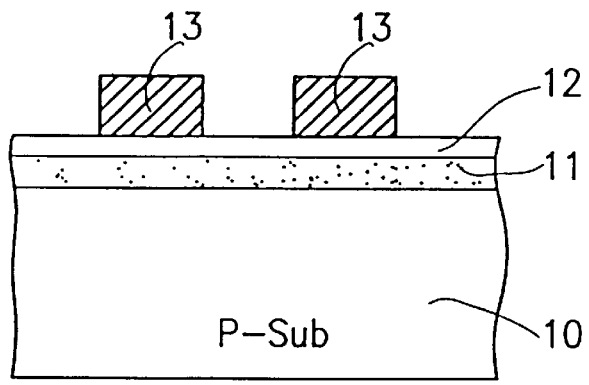
FIG. 1B is a cross-sectional view of the conventional ROM device of FIG. 1 cutting through the line 1B—1B.
Figure 1C:
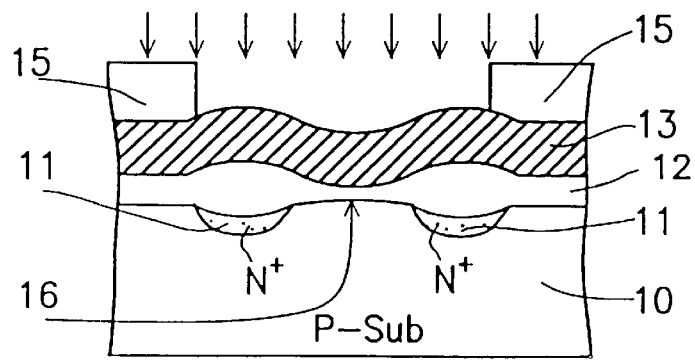
FIG. 1C is a cross-sectional view of the conventional ROM device of FIG. 1 cutting through the line 1C—1C.
Figure 2A:
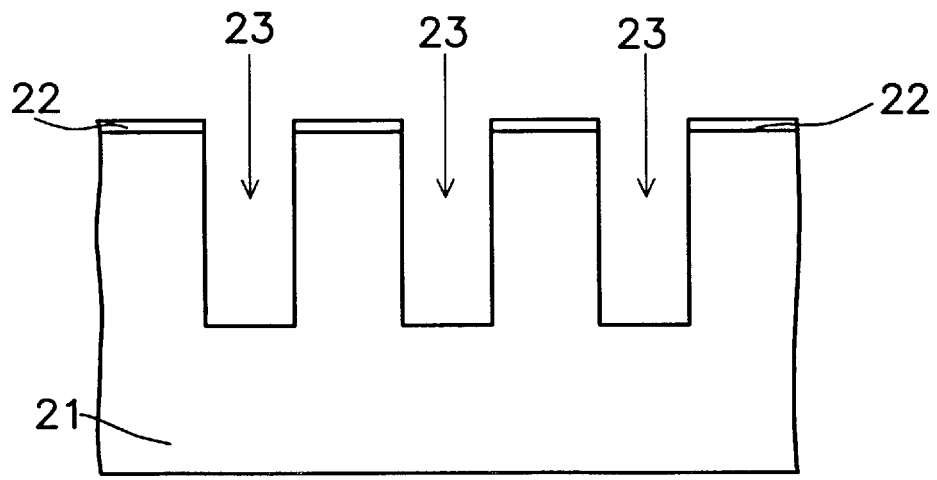
FIGS. 2A through 2G are schematic diagrams used to depict the steps involved in the method according to the invention for fabricating a ROM device.

Referring first to FIG. 2A, in the first step, a semiconductor substrate 21 of a first type, which can be either P-type or N-type, is prepared. Subsequently, a pad oxide layer 22 is formed over the substrate 21 by thermal oxidation. After this, a photoresist layer (not shown) is coated over the wafer, and then a photolithographic and etching process is performed on the wafer so as to remove selected portions of the photoresist layer to expose those areas on the wafer that are to be defined as source/drain regions for the MOSFET memory cells of the ROM device. By using the photoresist layer as a mask, a dry etching process, such as a reactive ion etching process, is performed on the wafer so as to etch away those portions of the pad oxide layer 22 and substrate 21 that are uncovered by the photoresist layer. Through this process, a plurality of substantially parallel-spaced trenches 23 are formed in the wafer, as illustrated in FIG. 2A. After this, the photoresist layer is removed.

Figure 2B:
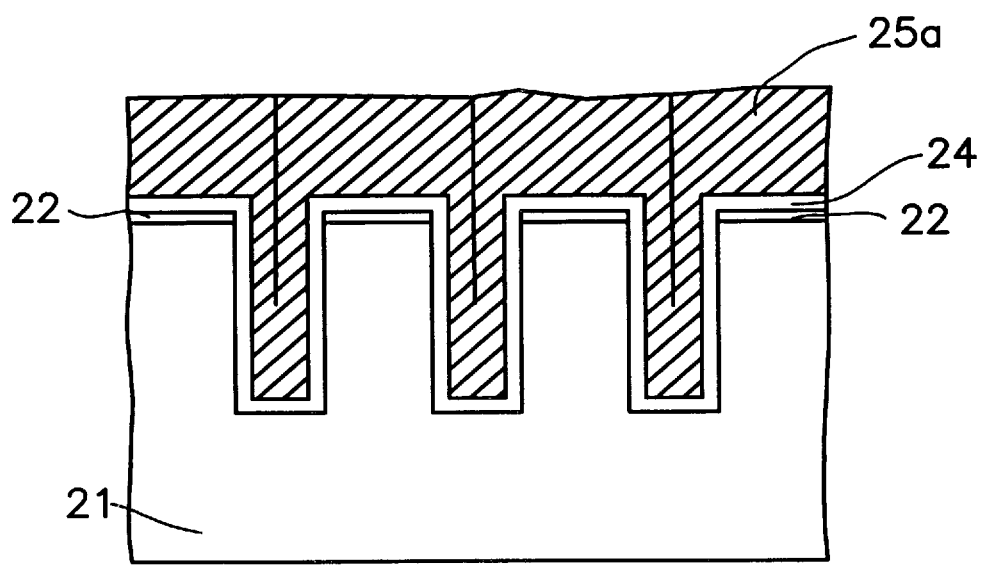

Referring next to FIG. 2B, in the subsequent step, an insulating layer 24, such as a layer of silicon dioxide or silicon nitride, is formed by chemical-vapor deposition (CVD), for example, on the inner walls of all of the trenches 23 and over the entire top surface of the pad oxide layer 22. Next, a first conductive layer 25a is formed to fill up all of the remaining empty spaces in the trenches 23 and to a thickness that extends beyond the top surface of the insulating layer 24.

Figure 2C:
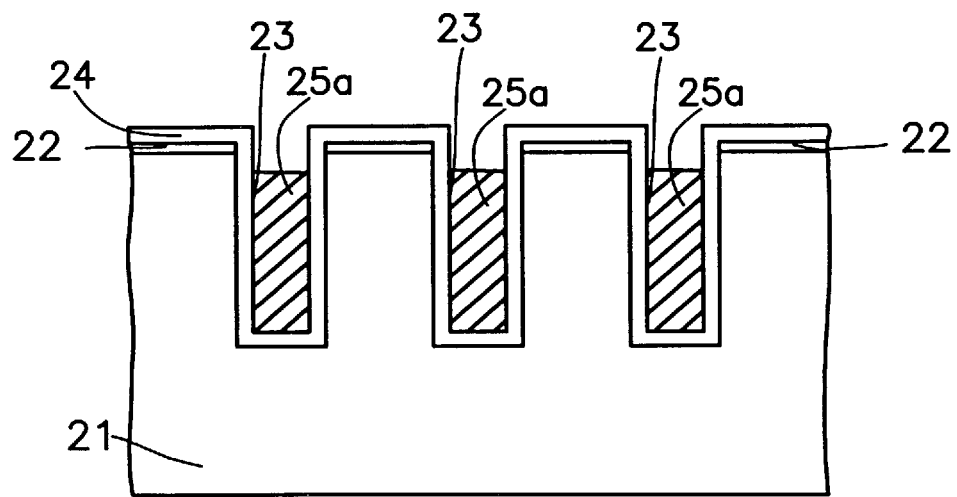

Referring further to FIG. 2C, subsequently, a dry etching process is performed on the wafer so as to etch away a top part of the first conductive layer 25a until the top surface of the remaining part of the first conductive layer 25a is below the topmost surface of the substrate 21. In FIG. 2C, the remaining part of the first conductive layer 25a is still labeled with the same reference numeral.

Alternatively, the first conductive layer 25a shown in FIG. 2C can be formed by using a spin-coating process to fill conductive material in the trenches 23 up to a level below the topmost surface of the substrate 21. This process also allows for good planarization of the top surface of the first conductive layer 25a.

The foregoing steps complete the fabrication of a semifinished product of the ROM device which is not yet mask programmed to store permanent data. After receiving a customer order which specifies the binary code that is to be programmed into the ROM device for permanent storage, a mask programming process is conducted on the semifinished product of the ROM device so as to store the customer-supplied binary code permanently in the ROM device. This process will be described in full detail in the following with reference to the ensuing FIGS. 2D, 2E, and 2F.

Figure 2D:
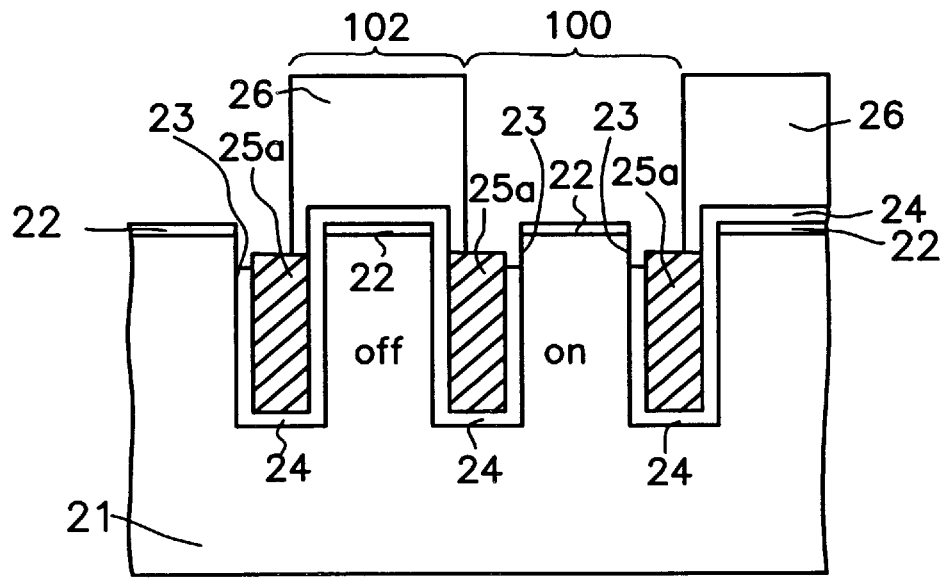

Referring first to FIG. 2D, the subsequent step is to conduct a mask programming process on the semi-finished product of ROM device shown in FIG. 2C. First, a photoresist layer 26 is coated over the entire top surface of the wafer. Then, a photolithographic and etching process is conducted on the wafer so as to remove selected portions of the photoresist layer 26 to expose those channel regions that are associated with a selected group of the MOSFET memory cells which are to be set to a permanently-ON state representing the permanent storage of a first binary digit, for example 0. On the other hand, the unexposed channel regions are associated with the MOSFET memory cells that are to be set to a permanently-OFF state representing the permanent storage of a second binary digit, for example 1. In FIG. 2D, for example, the MOSFET memory cell 100 is to be set to a permanently-ON state so that its channel region is exposed, while the MOSFET memory cell 102 is to be set to a permanently-OFF state so that its channel region is covered by the photoresist layer 26.

Subsequently, a wet etching process is conducted on the wafer so as to etch away the exposed portions of the insulating layer 24 until the topmost surface of those portions of the insulating layer 24 that are layered on the inner walls of the trenches 23 is below the topmost surface of the first conductive layer 25a in each of the trenches 23, as illustrated in FIG. 2D. The remaining portions of the insulating layer 24 are used to separate the first conductive layer 25a from the underlying substrate 21 so as to prevent the occurrence of leakage current.

Figure 2E:
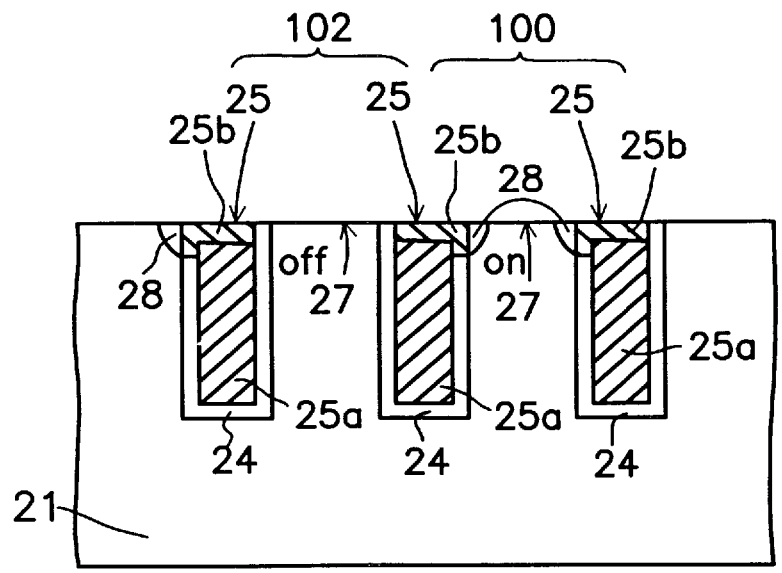

Referring next to FIG. 2E, subsequently, the photoresist layer 26 is removed. Then, a second conductive layer 25b, such as a layer of polysilicon layer, is formed by the CVD method over the wafer. Furthermore, the polysilicon layer is doped with a high concentration of impurity ions so as to increase the conductivity thereof. This highly-doped polysilicon layer fills up the spaces which are formed by the removal of part of the insulating layer 24 earlier. This allows part of the second conductive layer 25b to come into lateral contact with the top portions of the substrate 21 that are each located between each neighboring pair of the trenches 23, thus allowing the impurity ions to be diffused through the lateral contact into the substrate 21 to form a highly-doped diffusion region 28. After this, an isotropic etch-back process is conducted on the wafer, with the pad oxide layer 22 or insulating layer 24 serving as the etch end point, so as to remove a top part of the second conductive layer 25b until the topmost surface of the remaining part of the second conductive layer 25b is substantially leveled with the topmost surface of the substrate 21, as illustrated in FIG. 2E. After this, the portions of the substrate 21 that are layered over the topmost surface of the substrate 21, together with the pad oxide layer 22, are removed. Alternatively, the chemical mechanical polish (CMP) technique can be used instead of the foregoing etch-back process to remove the upper part of the second conductive layer 25b.

In each of the trenches 23, the first conductive layer 25a and the second conductive layer 25b in combination constitute one source/drain region which serves as one bit line for the ROM device. Since the source/drain regions are formed in trenches, they are hereinafter referred to as trench-type source/drain regions. Furthermore, the interval regions between the trench-type source/drain regions 25 are defined as channel regions 27.

Figure 2F:
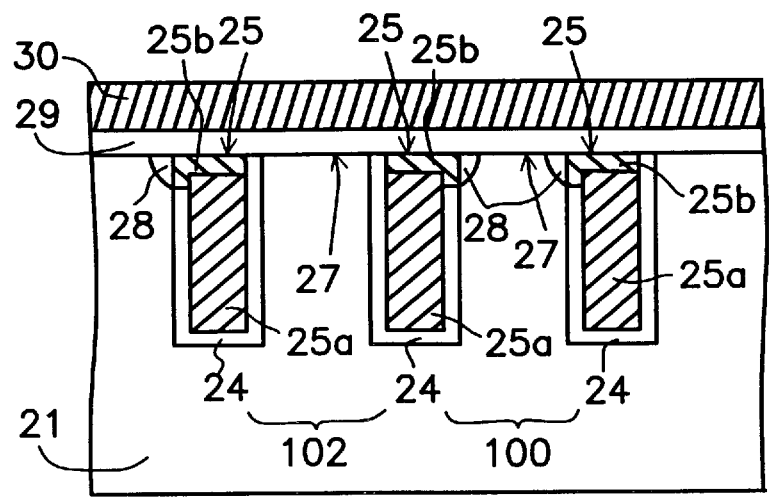

Referring further to FIG. 2F, in the subsequent step, a gate dielectric layer 29, such as a layer of silicon dioxide or a layer of silicon nitride, is formed by the CVD method over the wafer. Next, a third conductive layer 30 is formed over the gate dielectric layer 29. The third conductive layer 30 is formed by depositing a conductive material selected from the group consisting of polysilicon, aluminum, titanium, and tungsten, over the gate dielectric layer 29.

Figure 2G:
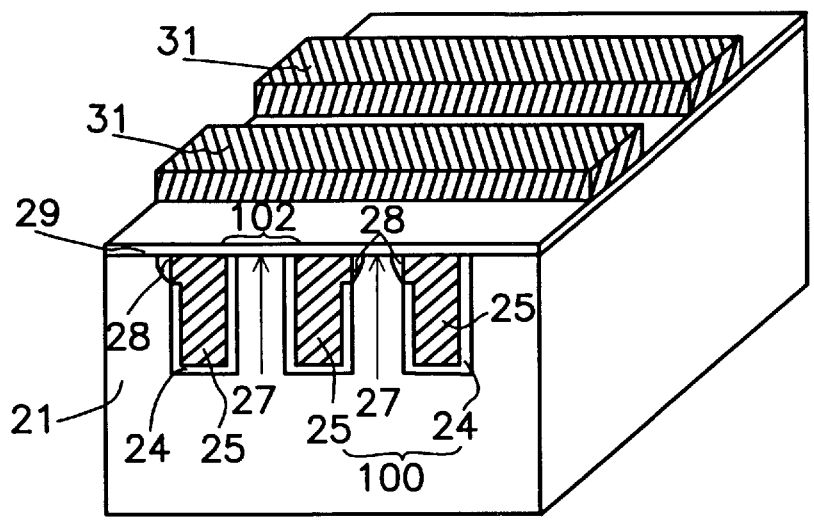

Referring also to FIG. 2G, a photolithographic and etching process is then conducted on the wafer so as to remove selected portions of the third conductive layer 30 to form a plurality of substantially parallel-spaced gates (word lines) 31 which intercross the trench-type source/drain regions (bit lines) 25 substantially at right angles. This completes the fabrication of the finished product of the ROM device.

In the above-disclosed ROM device, if the substrate 21 is P-type, the first and second conductive layers 25a, 25b are doped with N-type impurity ions. Conversely, if the substrate 21 is N-type, the first and second conductive layers 25a, 25b are doped with P-type impurity ions.

Figure 3:
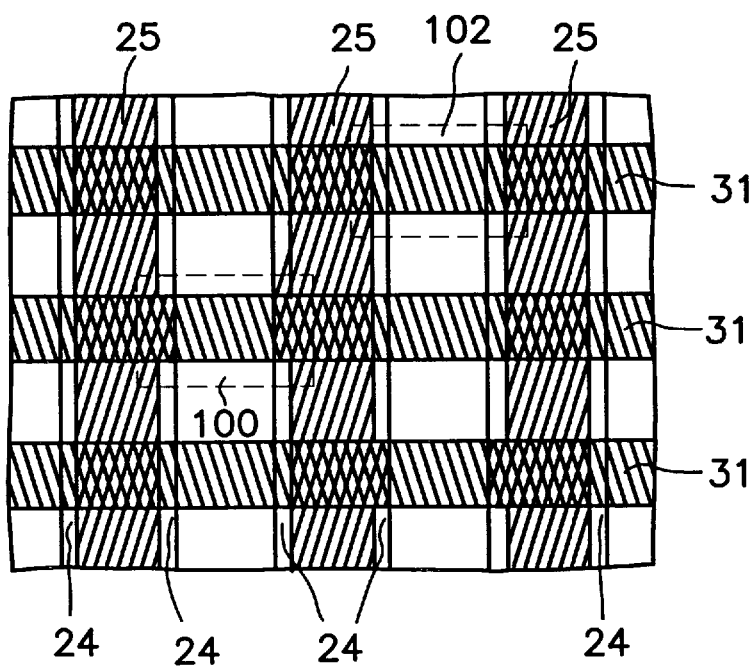
FIG. 3 is a schematic top view of the finished product of the ROM device.

FIG. 3 is a schematic top view of the finished product of the ROM device. This ROM device includes an array of MOSFET memory cells which can be accessed via the bit lines (the trench-type source/drain regions) 25 and the word lines (gates) 31. Each MOSFET memory cell is formed at a location associated with one segment of the word lines between each neighboring pair of the bit lines. For instance, in FIG. 3, the dashed box indicated by the reference numeral 100 indicates the location where one permanently-ON MOSFET memory cell is formed, while the dashed box indicated by the reference numeral 102 indicates the location where one permanently-OFF MOSFET memory cell is formed.

In conclusion, the ROM device of the invention has several advantages. First, the leakage current is substantially reduced since the trench-type source/drain regions are separated from the underlying substrate by an insulating layer formed at the bottom of the trench-type source/drain regions. Second, the ON/OFF states of the MOSFET memory cells in the ROM device are dependent on whether an insulating layer is provided between the associated channel regions and source/drain regions. This eliminates the ion implantation process for forming diffusion regions with different threshold voltages, and also allows for an increase in the operating voltage of the source/drain regions and thus an increase in the operating current of the MOSFET memory cells during access operation. Third, the forming of the source/drain regions by using conductive materials, such as polysilicon or metal, allows prevention of the breakdown voltage between the source/region junctions.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method for fabricating a read only memory (ROM) device, comprising the steps of:
    (1) preparing a semiconductor substrate of a first conductivity type, then forming a pad oxide layer over the substrate;
    (2) forming a plurality of substantially parallel-spaced trenches in the
    (3) forming an insulating layer which covers inner walls of the trenches and a top surface of the substrate;
    (4) forming a first conductive layer in the trenches, said first conductive layer having a top surface below the top surface of the substrate;
    (5) conducting a photolithographic and etching process on the insulating layer so as to remove selected portions of the insulating layer with a surface of the exposed portions of the insulating layer below the top surface of the first conductive layer;
    (6) forming a second conductive layer to fill up the trenches, the second conductive layer being doped with an impurity material of a second conductivity type and contacting the substrate to form a doped diffusion region on one of the inner walls;
    (7) conducting an etching process on the second conductive layer with the pad oxide layer and the insulating layer serving as etch end points so as to remove part of the second conductive layer until a top surface of the second conductive layer is substantially leveled with the top surface of the substrate, in each of the trenches, the first conductive layer and the second conductive layer in combination constitute one trench-type source/drain region serving as one bit line;
    (8) removing the pad oxide layer;
    (9) forming a gate dielectric layer over the second conductive layer;
    10) forming a third conductive layer over the gate dielectric layer; and
    (11) removing selected portions of the third conductive layer so as to form a plurality of substantially parallel-spaced gates serving as word lines along a second direction.

2. The method of claim 1, wherein the first conductivity type is N-type while the second conductivity type is P-type.

3. The method of claim 1, wherein the first conductivity type is P-type while the second conductivity type is N-type.

4. The method of claim 1, wherein in said step (2), the trenches are formed by a reactive ion etching process.

5. The method of claim 1, wherein in said step (3), the insulating layer is a layer of silicon dioxide.

6. The method of claim 1, wherein in said step (3), the insulating layer is a layer of silicon nitride.

7. The method of claim 2, wherein in said step (4), the first conductive layer is a layer of polysilicon doped with a P-type impurity material.

8. The method of claim 2, wherein in said step (4), the first conductive layer is a metallization layer of aluminum.

9. The method of claim 2, wherein in said step (4), the first conductive layer is a metallization layer of titanium.

10. The method of claim 2, wherein in said step (4), the first conductive layer is a metallization layer of tungsten.

11. The method of claim 3, wherein in said step (4), the first conductive layer is a layer of polysilicon doped with an N-type impurity material.

12. The method of claim 3, wherein in said step (4), the first conductive layer is a metallization layer of aluminum.

13. The method of claim 3, wherein in said step (4), the first conductive layer is a metallization layer of titanium.

14. The method of claim 3, wherein in said step (4), the first conductive layer is a metallization layer of tungsten.

15. The method of claim 1, wherein in said step (4), the first conductive layer is formed by the steps of:
    forming a layer of conductive material over the insulating layer and filling up the trenches; and
    conducting an etch-back process on the conductive material until a top surface thereof is below the top surface of the substrate, wherein a remaining part of the conductive material serves as the first conductive layer.

16. The method of claim 1, wherein in said step (4), the first conductive layer is formed by a spin coating process.

17. The method of claim 1, wherein in said step (6), the second conductive layer is a layer of polysilicon doped with an impurity material of the second conductivity type.

18. The method of claim 1, wherein in said step (7), the second conductive layer is selectively removed by an isotropic etch-back process.

19. The method of claim 1, wherein in said step (7), the second conductive layer is selectively removed by a chemical mechanical polishing (CMP) process.

20. The method of claim 1, wherein in said step (9), the gate dielectric layer is a layer of silicon dioxide.

21. The method of claim 1, wherein in said step (9), the gate dielectric layer is a layer of silicon nitride.

22. The method of claim 1, wherein in said step (10), the third conductive layer is a layer of doped polysilicon.

23. The method of claim 1, wherein in said step (10), the third conductive layer is a metallization layer of aluminum.

24. The method of claim 1, wherein in said step (10), the third conductive layer is a metallization layer of titanium.

25. The method of claim 1, wherein in said step (10), the third conductive layer is a metallization layer of tungsten.

26. The method of claim 1, wherein in said step (11), the second direction is substantially perpendicular to the first direction.

* * * * *